(12) United States Patent
Murakawa et al.

(10) Patent No.: US 12,068,442 B2
(45) Date of Patent: Aug. 20, 2024

(54) ELECTRONIC COMPONENT JOINING METHOD AND JOINED STRUCTURE

(71) Applicant: KYOCERA Corporation, Kyoto (JP)

(72) Inventors: Kentaro Murakawa, Kyoto (JP); Katsuaki Masaki, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 529 days.

(21) Appl. No.: 17/418,683

(22) PCT Filed: Dec. 26, 2019

(86) PCT No.: PCT/JP2019/051100
§ 371 (c)(1),
(2) Date: Jun. 25, 2021

(87) PCT Pub. No.: WO2020/138278
PCT Pub. Date: Jul. 2, 2020

(65) Prior Publication Data
US 2022/0069185 A1    Mar. 3, 2022

(30) Foreign Application Priority Data

Dec. 26, 2018    (JP) .................................. 2018-243576

(51) Int. Cl.
*H01L 33/62* (2010.01)
*H01L 33/40* (2010.01)
*H05K 3/34* (2006.01)

(52) U.S. Cl.
CPC .............. *H01L 33/62* (2013.01); *H01L 33/40* (2013.01); *H05K 3/34* (2013.01); *H01L 2933/0033* (2013.01)

(58) Field of Classification Search
CPC . H01L 33/62; H01L 33/40; H01L 2933/0033; H01L 2224/81193; H01L 33/36; H01L 21/60; H01L 24/00–98; H01L 2224/00–98; H05K 3/34; H05K 3/3457; H05K 1/111; H05K 3/3431;
(Continued)

(56) References Cited

U.S. PATENT DOCUMENTS

2006/0125076 A1* 6/2006 Fukagaya ............... H01L 24/97
257/E23.181
2006/0226434 A1* 10/2006 Hata ....................... H01L 33/32
257/94
(Continued)

FOREIGN PATENT DOCUMENTS

JP    2001-057468 A    2/2001
JP    2007-329156 A    12/2007
(Continued)

*Primary Examiner* — Mohammad A Rahman
(74) *Attorney, Agent, or Firm* — Procopio, Cory, Hargreaves & Savitch (57) ABSTRACT

The present disclosure relates to an electronic component joining method and a joined structure. A solder layer made of a gold-tin alloy including 20 mass % or greater of tin is formed on a light-emitting element side, and a layer including gold as a main component is formed, as a joining layer for joining to the solder layer, on a submount side. The solder layer and the joining layer are heated at a temperature below the melting point of the gold-tin alloy of the solder layer to join the light-emitting element and the submount.

14 Claims, 4 Drawing Sheets

(58) Field of Classification Search
CPC .. H05K 2201/0338; H05K 2201/10106; Y02P 70/50
See application file for complete search history.

(56) References Cited

U.S. PATENT DOCUMENTS

| | | |
|---|---|---|
| 2013/0119118 A1 | 5/2013 | Shimizu et al. |
| 2013/0145810 A1 | 6/2013 | Hsieh et al. |
| 2013/0244361 A1* | 9/2013 | Chinone ................ H01L 24/32 438/29 |

FOREIGN PATENT DOCUMENTS

| | | |
|---|---|---|
| JP | 2013-119118 A | 6/2013 |
| JP | 2015-138870 A | 7/2015 |

* cited by examiner

ELECTRONIC COMPONENT JOINING METHOD AND JOINED STRUCTURE

TECHNICAL FIELD

The present disclosure relates to an electronic component joining method of joining an electronic component to a joint target object using a solder made of a gold-tin alloy and relates to a joined structure.

BACKGROUND ART

In methods of manufacturing a light-emitting device in which a light-emitting element, i.e., an electronic component, and a submount are joined via a solder layer, a technique is known for suppressing extrusion of the solder layer (see for example Patent Document 1).

CITATION LIST

Patent Document

Patent Document 1: Japanese application publication No. 2015-138870

SUMMARY

An electronic component joining method of the present disclosure is a method of joining a side of an electronic component including an electrode and a side of a mount target object including a mounting surface on which the electronic component is to be mounted, the method including a layer forming step and a joining step. In the layer forming step, a solder layer made of a gold-tin alloy including 20 mass % or greater of tin is formed on the electrode of the electronic component, and a joining layer including gold as a main component is formed on the mounting surface of the mount target object. In the joining step, the solder layer and the joining layer are heated at a temperature smaller than the melting point of the gold-tin alloy and joined.

A joined structure for an electronic component of the present disclosure is a joined structure for an electronic component in which a side of an electronic component including an electrode and a side of a mount target object including a mounting surface on which the electronic component is to be mounted are joined. The joined structure includes a solder layer made of a gold-tin alloy including 20 mass % or greater of tin, the solder layer being located on the electrode of the electronic component, a joining layer including gold as a main component, the joining layer being located on the mounting surface of the mount target object, and an intermediate layer made of a gold-tin alloy with a lower melting point than a melting point of the solder layer, the intermediate layer being located between the solder layer and the joining layer.

DESCRIPTION OF EMBODIMENTS

Objects, features, and advantages of the present invention will become more apparent from the following detailed description and drawings.

An electronic component joining method and a joined structure therefor according to embodiments of the present disclosure will be described below. The joining method of the present embodiment is a method of joining a side of an electronic component including an electrode to a side of a mount target object including a mounting surface on which the electronic component is to be mounted. Furthermore, the method includes a layer forming step and a joining step and can be applied when a gold-tin alloy described below can be used for joining. In the examples described below, the electronic component is a light-emitting element such as a light-emitting diode, and the mount target object is a submount. However, no such limitation is intended.

For example, in a case where the light-emitting element is fixed to the submount, the electrode (semiconductor layer) of the light-emitting element and the submount are joined using solder. Solder is melted and then solidifies to form a solder joint. At this time, internal stress is generated in the solidified solder layer, which may cause failure, such as cracking in the solder layer and peeling of the solder layer. Furthermore, during joining, a constant pressure is applied to the light-emitting element and the submount. Thus, the melted solder may be spread laterally by the applied pressure, causing a short circuit in the adjacent electrodes.

In a known joining method, a plurality of pairs of gold layers and gold-tin layers need to be stacked, making the process of forming the solder complex. Furthermore, in the plurality of solder layers, a failure such as that described above can occur. Moreover, for example, in a case where the heights of the electrodes are different, a greater amount of solder is added onto one or more electrodes to make the joint heights the same, making it difficult to suppress the spread of the solder.

Figure 1:
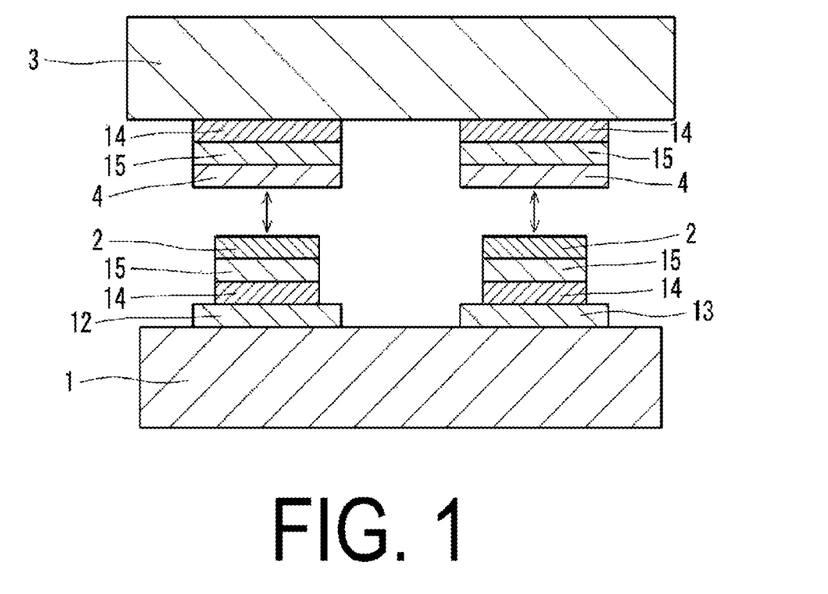
FIG. 1 is a cross-sectional view schematically illustrating a joining method according to a first embodiment.

FIG. 1 is a diagram schematically illustrating a joining method according to a first embodiment. As illustrated in FIG. 1, a light-emitting device obtained by the joining method according to the present embodiment includes a light-emitting element 1, a solder layer 2, a submount 3, and a joining layer 4. The light-emitting element 1 and the submount 3 are joined together via the solder layer 2 and the joining layer 4.

The configuration of the light-emitting element 1 is not particularly limited, and a known configuration can be used. For example, in the present embodiment, a configuration can be used in which a semiconductor layer made of a group III nitride semiconductor is formed on a sapphire substrate. Light is extracted from a surface of the sapphire substrate opposite to the surface on which the semiconductor layer is provided. The semiconductor layer has a structure in which an n-layer, a light-emitting layer, and a p-layer are stacked in this order from the sapphire substrate side. A first electrode 12 is provided on the p-layer of the semiconductor layer, and a second electrode 13 is provided on the n-layer exposed on the bottom surface of the groove that reaches from the p-layer side to the n-layer. The first electrode 12 and the second electrode 13 are two electrodes formed on the same surface. The edge of the first electrode 12 and the edge of the second electrode 13 are separated by, for example, approximately 50 μm to 200 μm.

A first cohesion layer 14 may be located on each of the first electrode 12 and the second electrode 13, and a diffusion prevention layer 15 may be located on each first cohesion layer 14. The first cohesion layer 14 includes at least one of Cr or Ti as a main component, for example. The diffusion prevention layer 15 includes, for example, a platinum group element, such as Pt, Rh, Pd, Ir, Ru, and Os, as a main component. Here, the "main component" refers to a component that makes up not less than 50 mass % in all components. The same applies to a "main component" described below. The diffusion prevention layer 15 inhibits the diffusion of the metal of the solder layer 2 described below toward the first electrode 12 and the second electrode 13. For example, the thickness of the first cohesion layer 14 ranges from 5 nm to 50 nm, and the thickness of the diffusion prevention layer 15 ranges from 10 nm to 100 nm.

The submount 3, which is the mount target object, is not particularly limited and may be an AlN substrate or an SiC substrate or the like having good thermal conductivity for the purpose of escaping heat generated by the mounted light-emitting element 1. Pattern electrodes (not illustrated) are formed in advance on the mounting surface of the submount 3. The side of the pattern electrodes and the side of the first electrode 12 and the second electrode 13 of the light-emitting element 1 are joined via the solder layer 2, the joining layer 4, and the like. Here, the submount 3 may be a submount that is divided in advance per element.

A first cohesion layer 14 including for example at least one of Cr or Ti as a main component may be provided on each pattern electrode, and a diffusion prevention layer 15 including a platinum group element such as Pt as a main component may be provided on the first cohesion layer 14. The diffusion prevention layer 15 inhibits the diffusion of the metal of the solder layer 2 described below toward the pattern electrode. For example, the thickness of the first cohesion layer 14 ranges from 5 nm to 50 nm, and the thickness of the diffusion prevention layer 15 ranges from 10 nm to 100 nm.

The joining layer 4 includes gold as a main component, in particular 80 mass % or greater of gold, and is formed on (above) the mounting surface of the submount 3. Specifically, the joining layer 4 is formed on (above) the pattern electrode. The joining layer 4 is joined to the solder layer 2 described below, thus joining and fixing the light-emitting element 1 above (below in the drawing) the submount 3. The thickness of the joining layer 4 is, for example, from 30 nm to 500 nm. In a configuration in which the first cohesion layer 14 and the diffusion prevention layer 15 are provided on the pattern electrode, the joining layer 4 is formed on the diffusion prevention layer 15.

The solder layer 2 is a layer formed from a gold-tin alloy including not less than 20 mass % of tin (for example, 20 mass % or greater and 30 mass % or less of tin) and is formed above each of the first electrode 12 and the second electrode 13. By joining the solder layer 2 to the joining layer 4, the light-emitting element 1 is joined and fixed above the submount 3. The thickness of the solder layer 2 is, for example, from 0.5 μm to 5 μm. In a configuration in which the first cohesion layer 14 and the diffusion prevention layer 15 are provided on each of the first electrode 12 and the second electrode 13, the solder layer 2 is formed on the diffusion prevention layer 15.

In the layer forming step, the solder layer 2 made of a gold-tin alloy including not less than 20 mass % of tin is formed above each of the first electrode 12 and the second electrode 13 of the light-emitting element 1. Furthermore, the joining layer 4 including gold as a main component is formed above the mounting surface of the submount 3. The method of forming the solder layer 2 above each of the first electrode 12 and the second electrode 13 of the light-emitting element 1 may be any method as long as the method can form a gold-tin alloy film, such as a binary vapor deposition method or a sputtering method. In addition, the method of forming the joining layer 4 above the pattern electrode of the submount 3 may be any method as long as the method can form a gold film, such as a vapor deposition method, a sputtering method, or a plating method. The first cohesion layer 14 and the diffusion prevention layer 15 can also be formed using a vapor deposition method, a sputtering method, or the like.

In this manner, in the layer forming step, the solder layer 2 made of a gold-tin alloy including not less than 20 mass % of tin is formed on the side of the light-emitting element 1, and the joining layer 4 is formed on the side of the submount 3. Thereafter, in the joining step, the side of the light-emitting element 1 and the side of the submount are joined. The sides of the first electrode 12 and the second electrode 13 of the light-emitting element 1 are joined to the sides of the pattern electrodes of the submount 3, and these electrodes are electrically connected. In the joining step, the solder layer 2 and the joining layer 4 are pressed and joined while being heated at a temperature below the melting point of the gold-tin alloy of the solder layer 2 using a heater in a vacuum, for example. For example, the melting point of the gold-tin alloy including 23.5 mass % of tin is approximately 330° C., and pressing and joining are performed while the gold-tin alloy is heated at approximately 310° C. However, in the solder layer 2 of the present embodiment, for example, a gold-tin alloy including 20 mass % or greater and 30% or less of tin may be used. At this time, the heating temperature in the joining step is a temperature below the melting point of the gold-tin alloy and is, for example, from 280° C. to 380° C.

When the solder layer 2 made of an alloy is heated at a temperature below the melting point of the gold-tin alloy, the surface layer portion is melted. In a state in which the solder layer 2 and the joining layer 4 are pressed and joined, the solder layer 2 is melted at the interface between the solder layer 2 and the joining layer 4. When the joining layer 4 is also similarly melted in the vicinity of the interface, and thus both the solder layer 2 and the joining layer 4 are melted in the vicinity of the interface, the gold of the joining layer 4 diffuses into the gold-tin alloy of the solder layer 2 and the tin diffuses into the joining layer 4. In the vicinity of the interface, the composition of the gold-tin alloy changes, and, with an increase in melting point, the melted portion in the vicinity of the interface solidifies. In known solder joining, the entire solder is melted by heating, and the melted solder tends to spread out and cause a short circuit and the like. In the present embodiment, by heating at a temperature below the melting point, the vicinity of the interface between the solder layer 2 and the joining layer 4 is melted, the composition of the gold-tin alloy changes locally, and the melting point of that portion increases, allowing the melted portion to solidify without cooling. The thermal expansion coefficient of this solidified portion is a value between those of the solder layer 2 and the joining layer 4. Thus, the internal stress generated upon cooling and solidification can be reduced, and failure, such as cracking and peeling, can be minimized or prevented. Furthermore, because only the vicinity of the interface between the solder layer 2 and the joining layer 4 is melted, spreading of the solder layer 2 during joining can be suppressed. In the present embodiment, it is only required that the solder layer 2 made of a gold-tin alloy be formed, so the formation of the solder layer 2 is easy. In addition, since the vicinity of the interface between the solder layer 2 and the joining layer 4 is melted, spreading tends not to increase even if the thickness of the solder layer 2 is increased.

Regarding various conditions other than the heating temperature in the joining step, for example, the pressure applied to the light-emitting element 1 and the submount 3 during joining may be from 0.1 MPa to 3 MPa, and the amount of time during which the pressure is applied may be from 30 seconds to 1 hour.

Figure 2:
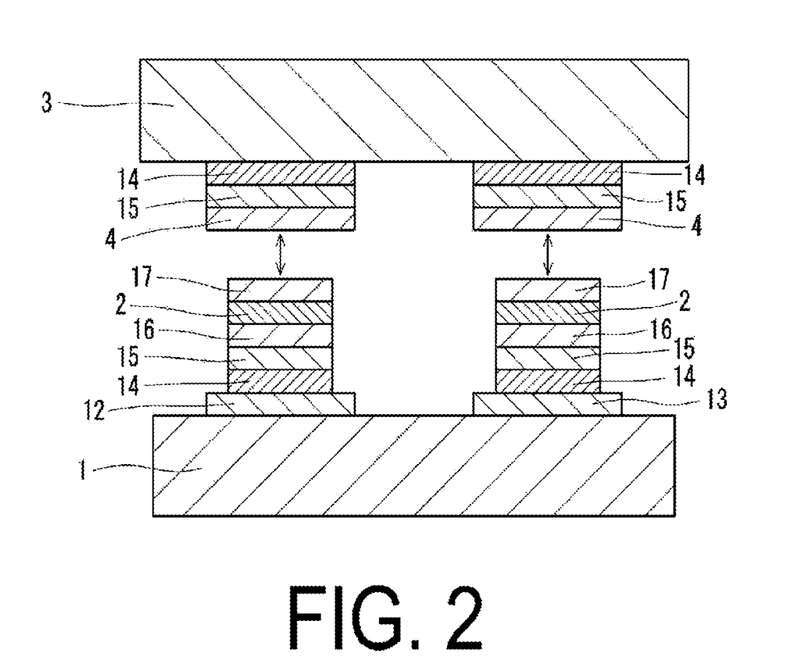
FIG. 2 is a cross-sectional view schematically illustrating a joining method according to a second embodiment.

FIG. 2 is a diagram schematically illustrating a joining method according to a second embodiment. The present embodiment differs from the first embodiment in that at least one of a cohesion layer or an antioxidant layer is further formed above each of the first electrode 12 and the second electrode 13 of the light-emitting element 1. The present embodiment is the same as the first embodiment in terms of other points.

A second cohesion layer 16 includes gold as a main component and is formed between the first electrode 12 and the solder layer 2 and between the second electrode 13 and the solder layer 2. The second cohesion layer 16 improves cohesion between the solder layer 2 and each electrode. In a configuration in which the diffusion prevention layer 15 is formed, the second cohesion layer 16 improves cohesion between the side of the diffusion prevention layer 15 and the side of the solder layer 2. The second cohesion layer 16 has a thickness ranging from 30 nm to 300 nm, for example.

An antioxidant layer 17 includes gold as a main component and is formed on the surface of the solder layer 2. The antioxidant layer 17 inhibits oxidation of the surface of the solder layer 2. When the surface of the solder layer 2 is oxidized, the adhesive strength drops. The antioxidant layer 17 has a thickness ranging from 30 nm to 300 nm, for example. The antioxidant layer 17 includes gold as a main component similar to the joining layer 4. In the joining step, heat is applied at a temperature smaller than the melting point of the solder layer 2 as in the first embodiment, thereby melting the vicinity of the interface between the solder layer 2 and the joining layer 4, including the antioxidant layer 14. In the vicinity of the interface, the gold and tin diffuse, and the melting point of the melted portion locally increases, allowing the melted portion to solidify without cooling.

In the present embodiment, it is only required that one of the second cohesion layer 16 or the antioxidant layer 17 be provided, but both may be provided. The method of forming the second cohesion layer 16 and the antioxidant layer 17 may be any method as long as the method can form a gold film, such as a vapor deposition method or a sputtering method. Various joining conditions in the joining step may be the same as in the first embodiment.

Figure 3:
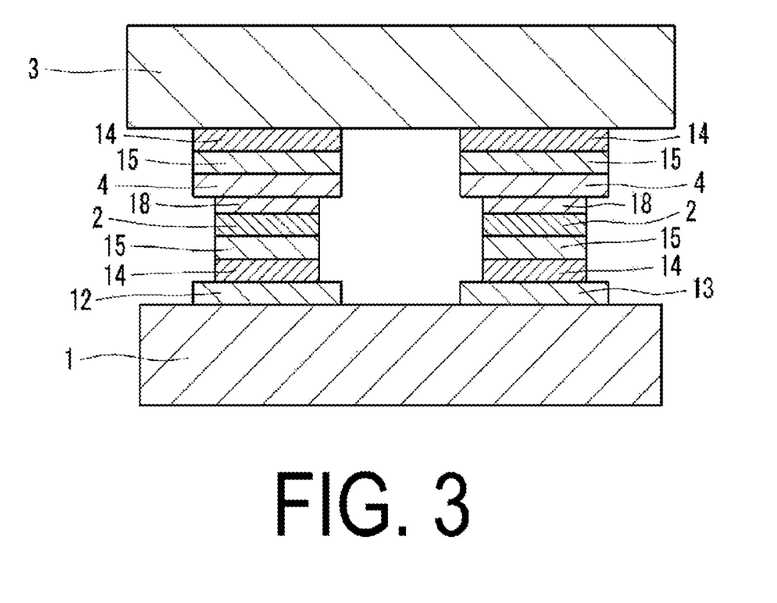
FIG. 3 is a cross-sectional view schematically illustrating a joined structure according to a third embodiment.

FIG. 3 is a cross-sectional view schematically illustrating a joined structure according to a third embodiment. The joined structure according to the present embodiment is a structure in which the side of the submount 3 and the side of the light-emitting element 1 are joined by the joining method according to the first embodiment. Each of the layers is the same as in the first embodiment, and thus the same reference numerals are assigned and descriptions thereof will be omitted. In the present embodiment, an intermediate layer 18 is formed between the solder layer 2 and the joining layer 4 in a case where joining is performed by the joining method of the first embodiment. The intermediate layer 18 located between the solder layer 2 and the joining layer 4 is made of a gold-tin alloy having a lower melting point than the solder layer 2. The intermediate layer 18 has a larger proportion of gold than that of the composition of the gold-tin alloy of the solder layer 2, for example. The thermal expansion coefficient of the intermediate layer 18 with such a composition is a value between those of the solder layer 2 and the joining layer 4. Thus, the internal stress generated upon cooling can be reduced, and failure, such as cracking and peeling, can be minimized or prevented.

The intermediate layer 18 has a thickness ranging from 0.1 μm to 1 μm, for example. The gold-tin alloy of the intermediate layer 18 includes 19 mass % or greater and less than 20 mass % of tin, and the melting point is higher than 280° C. and 360° C. or lower.

Figure 4:
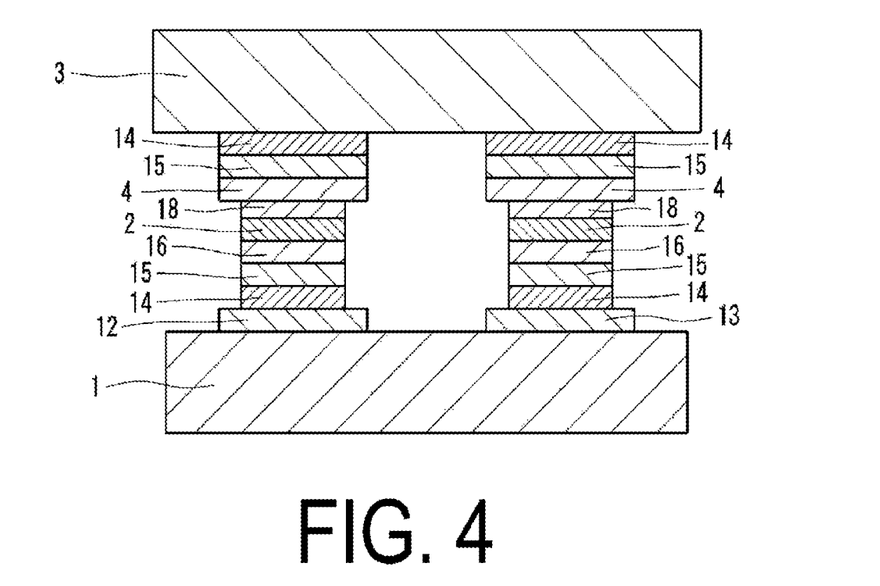
FIG. 4 is a cross-sectional view schematically illustrating a joined structure according to a fourth embodiment.

FIG. 4 is a cross-sectional view schematically illustrating a joined structure according to a fourth embodiment. The joined structure according to the present embodiment is a structure in which the side of the submount 3 and the side of the light-emitting element 1 are joined by the joining method according to the second embodiment. Each of the layers is the same as in the second embodiment, and thus the same reference numerals are assigned and descriptions thereof will be omitted. In the present embodiment, when joining is performed by the joining method of the second embodiment, the entire antioxidant layer 17 diffuses into the solder layer 2, and further a portion of the joining layer 4 diffuses. In the joined structure of the present embodiment, the antioxidant layer 17 diffuses into the solder layer 2 and thus disappears, and the intermediate layer 18 is positioned between the solder layer 2 and the joining layer 4. As in the third embodiment, the intermediate layer 18 is made of a gold-tin alloy having a lower melting point than the solder layer 2, can reduce the internal stress that occurs, and can minimize or prevent failures, such as cracking and peeling.

In addition, as a modified example that is opposite to the embodiments described above, the solder layer 2 may be formed on the side of the submount 3, and the joining layer 4 may be formed on the side of the light-emitting element 1.

Next, an example of the present embodiments will be described.

EXAMPLE

A quartz substrate was prepared as a test substrate, and the cohesion layer (Cr) 14 (thickness: 10 nm), the diffusion prevention layer (Pt) 15 (thickness: 25 nm), the cohesion layer (Au) 16 (thickness: 100 nm), the solder layer 2 (thickness: 1 μm or 2 μm), and the antioxidant layer (Au) 17 (thickness: 100 nm) were stacked in this order. In a sample with a solder layer 2 having a film thickness of 1 μm, the solder layer 2 was a layer made of a gold-tin alloy (melting point: 360° C.) including 27.2 mass % of tin. In a sample with a solder layer 2 having a film thickness of 2 μm, the solder layer 2 was a layer made of a gold-tin alloy (melting point: 330° C.) including 23.5 mass % of tin. In the joining step, the heating temperature of the sample with the solder layer 2 having a film thickness of 1 μm was set to 340° C., the heating temperature of the sample with the solder layer 2 having a film thickness of 2 μm was set to 310° C., the set pressure was set to 5 mbar, and the pressure contact time was set to 1 minute.

Comparative Example

A comparative example was the same as the example except that the heating temperature was set to 380° C.

In the connected structure obtained after performing the joining step, it was confirmed that in the example, the intermediate layer 18 was formed between the solder layer 2 and the joining layer 4. The intermediate layer 18 contained 19.5 mass % of tin and had a melting point of 310° C. The confirmation of the intermediate layer 18 was performed by a known measurement method using a combination of scanning electron microscope (SEM) and energy dispersive x-ray analysis (EDX). In addition, in the comparative example, the entire solder layer 2 was melted and then cooled and solidified, resulting in that no intermediate layer 18 was confirmed. In the example, the presence of the intermediate layer 18 minimizes or prevents failures, such as cracking and peeling. On the other hand, in the comparative example, because the intermediate layer 18 is not present, failures, such as cracking and peeling, are not minimized or prevented.

The width of the solder layer prior to joining was 20 μm in both the example and the comparative example, and the width of the solder layer after joining was compared. In the sample with the solder layer 2 having a film thickness of 1 μm, the width after joining was 23.6 μm in the comparative example. In contrast, the width after joining was 23 μm in the example, and thus the spread of the solder layer was suppressed slightly. In the sample with the solder layer 2 having a film thickness of 2 μm, the width after joining was 37.6 μm in the comparative example. In contrast, the width after joining was 31 μm in the example, and thus the spread of the solder layer was greatly suppressed.

The present disclosure can be applied in many forms without departing from its spirit or key characteristics. Accordingly, the foregoing embodiments are merely examples in all respects, and the scope of the present invention is set forth in the claims and is not limited in any way by the specification. Furthermore, all variations and modifications that come within the scope of the claims are within the scope of the present invention.

REFERENCE SIGNS LIST

1 Light-emitting element
2 Solder layer
3 Submount
4 Joining layer
12 First electrode
13 Second electrode
14 First cohesion layer
15 Diffusion prevention layer
16 Second Cohesion layer
17 Antioxidant layer
18 Intermediate layer

The invention claimed is:

1. An electronic component joining method of joining a side of an electronic component comprising an electrode and a side of a mount target object comprising a mounting surface, the electronic component joining method comprising:
a layer forming step of forming a solder layer made of a gold-tin alloy comprising 20 mass % or greater of tin above the electrode of the electronic component, and forming a joining layer comprising gold as a main component above the mounting surface of the mount target object; and
a joining step of heating the solder layer and the joining layer at a temperature lower than a melting point of the gold-tin alloy, and joining the solder layer and the joining layer,
wherein
in the layer forming step, a first cohesion layer is formed on-above the electrode, and the solder layer is formed above a surface of the first cohesion layer.

2. The electronic component joining method according to claim 1, wherein
in the layer forming step, a second cohesion layer comprising gold as a main component is formed above the first cohesion layer with a diffusion prevention layer comprising a platinum group element as a main component disposed between the first cohesion layer and the second cohesion layer.

3. The electronic component joining method according to claim 1, wherein
the electronic component comprises a light-emitting element.

4. The electronic component joining method according to claim 1, wherein
the electronic component comprises at least two electrodes on a surface of the electronic component facing the mounting surface of the mount target object.

5. The electronic component joining method according to claim 1, wherein
in the layer forming step, an antioxidant layer comprising gold as a main component is further formed on a surface of the solder layer.

6. The electronic component joining method according to claim 1, wherein
in the layer forming step, an antioxidant layer comprising gold as a main component is further formed on a surface of the solder layer, and the electronic component comprises at least two electrodes on a surface of the electronic component facing the mounting surface of the mount target object.

7. The electronic component joining method according to claim 1, wherein
in the layer forming step, an antioxidant layer comprising gold as a main component is further formed on a surface of the solder layer, and in the layer forming step, a second cohesion layer comprising gold as a main component is formed above the first cohesion layer with a diffusion prevention layer comprising a platinum group element as a main component disposed between the first cohesion layer and the second cohesion layer.

8. The electronic component joining method according to claim 1, wherein
in the layer forming step, a second cohesion layer comprising gold as a main component is formed above the first cohesion layer with a diffusion prevention layer comprising a platinum group element as a main component disposed between the first cohesion layer and the second cohesion layer, and the electronic component comprises at least two electrodes on a surface of the electronic component facing the mounting surface of the mount target object.

9. The electronic component joining method according to claim 1, wherein
the electronic component comprises a light-emitting element, and the electronic component comprises at least two electrodes on a surface of the electronic component facing the mounting surface of the mount target object.

10. A joined structure having an electronic component comprising an electrode, and a mount target object comprising a mounting surface, the joined structure comprising:
a solder layer made of a gold-tin alloy comprising 20 mass % or greater of tin, the solder layer located above the electrode of the electronic component;

a joining layer comprising gold as a main component, the joining layer located below the mounting surface of the mount target object;

an intermediate layer made of a gold-tin alloy with a lower melting point than a melting point of the solder layer, the intermediate layer being located between the solder layer and the joining layer; and a cohesion layer comprising gold as a main component, the cohesion layer being located between the electrode and the solder layer.

11. The joined structure for the electronic component according to claim 10, wherein
the solder layer is a gold-tin alloy comprising 20 mass % or greater and 30 mass % or less of tin.

12. The joined structure for the electronic component according to claim 10, wherein
the solder layer is a gold-tin alloy comprising 20 mass % or greater and 30 mass % or less of tin, and the electronic component comprises at least two electrodes on a surface facing the mounting surface of the mount target object.

13. The joined structure for the electronic component according to claim 10, wherein
the electronic component comprises at least two electrodes on a surface facing the mounting surface of the mount target object.

14. A joined structure having an electronic component comprising a first electrode and a second electrode, and a mount target object comprising a mounting surface, the joined structure comprising:

a solder layer made of a gold-tin alloy comprising 20 mass % or greater of tin, the solder layer located above the electrode of the electronic component;

a joining layer comprising gold as a main component, the joining layer located below the mounting surface of the mount target object; and an intermediate layer made of a gold-tin alloy with a lower melting point than a melting point of the solder layer, the intermediate layer being located between the solder layer and the joining layer, wherein the electronic component comprises the first and the second electrodes on a surface facing the mounting surface of the mount target object.

* * * * *